(12) United States Patent
Kobayashi et al.

(10) Patent No.: US 8,253,075 B2
(45) Date of Patent: Aug. 28, 2012

(54) HEAT TREATMENT APPARATUS, HEATER, AND METHOD FOR MANUFACTURING THE HEATER

(75) Inventors: Makoto Kobayashi, Nirasaki (JP); Kenichi Yamaga, Nirasaki (JP); Takanori Saito, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1069 days.

(21) Appl. No.: 12/223,162

(22) PCT Filed: Feb. 7, 2007

(86) PCT No.: PCT/JP2007/052144
§ 371 (c)(1),
(2), (4) Date: Jul. 24, 2008

(87) PCT Pub. No.: WO2007/097199
PCT Pub. Date: Aug. 30, 2007

(65) Prior Publication Data
US 2010/0224614 A1    Sep. 9, 2010

(30) Foreign Application Priority Data
Feb. 20, 2006    (JP) ................................. 2006-042707

(51) Int. Cl.
*F27B 5/08* (2006.01)
*F27B 5/16* (2006.01)
*F27D 1/12* (2006.01)
(52) U.S. Cl. ........ 219/411; 219/390; 219/407; 118/725; 392/416
(58) Field of Classification Search .................. None
See application file for complete search history.

(56) References Cited

U.S. PATENT DOCUMENTS

| 5,097,890 | A | * | 3/1992 | Nakao | 165/206 |
| 5,346,555 | A | * | 9/1994 | Nunotani et al. | 118/724 |
| 6,414,277 | B1 | * | 7/2002 | Nanbu et al. | 219/390 |
| 7,888,622 | B2 | * | 2/2011 | Nakao et al. | 219/390 |
| 2002/0025688 | A1 | | 2/2002 | Kato | |
| 2008/0232787 | A1 | * | 9/2008 | Ichikawa et al. | 392/416 |

FOREIGN PATENT DOCUMENTS

JP    62-142739    6/1987
(Continued)

OTHER PUBLICATIONS

JP2004-311775A, Miyata et al, Nov. 2004, partial translation.*
(Continued)

*Primary Examiner* — Jospeh M Pelham
(74) *Attorney, Agent, or Firm* — Smith, Gambrell & Russell, LLP

(57) ABSTRACT

A heat treatment apparatus with a process chamber, a tubular heater, a heat exhaust system and a cooling section. The heater surrounds an outer circumference of the process chamber. The heat exhaust system exhausts an atmosphere in a space between the heater and the process chamber. The cooling section blows a cooling fluid into the space to cool the atmosphere. The heater includes a tubular heat insulator, a heat generating resistor on an inner circumference of the heat insulator, and an outer shell provided on an outer circumference of the heat insulator. The cooling section includes at least one annular flow path between the heat insulator and the outer shell, and an outlet in the heat insulator. The outlet blows cooling fluid toward a vertical central axis of the heat insulator, or in a direction oblique to the direction toward vertical central axis of the heat insulator.

10 Claims, 6 Drawing Sheets

FOREIGN PATENT DOCUMENTS

| | | |
|---|---|---|
| JP | 64-48022 | 3/1989 |
| JP | 08-195351 | 7/1996 |
| JP | 11-260744 | 9/1999 |
| JP | 2000-195808 | 7/2000 |
| JP | 2002-75890 | 3/2002 |
| JP | 2004-311775 | 11/2004 |
| JP | 2005-217335 | 8/2005 |

OTHER PUBLICATIONS

JP11-260744A, Hosaka, Sep. 1999, partial translation.*

Japanese Office Action issued on Mar. 1, 2011 for Application No. 2006-042707 w/ English language translation.

PCT Notification of Transmittal of Translation of the International Preliminary Examination Report (Form PCT/IB/338) dated Jan. 2004.

PCT International Preliminary Report on Patentability (Form PCT/IB/373) dated Jan. 2004.

PCT Written Opinion of the International Searching Authority (Form/ISA/237) dated Apr. 2005.

* cited by examiner

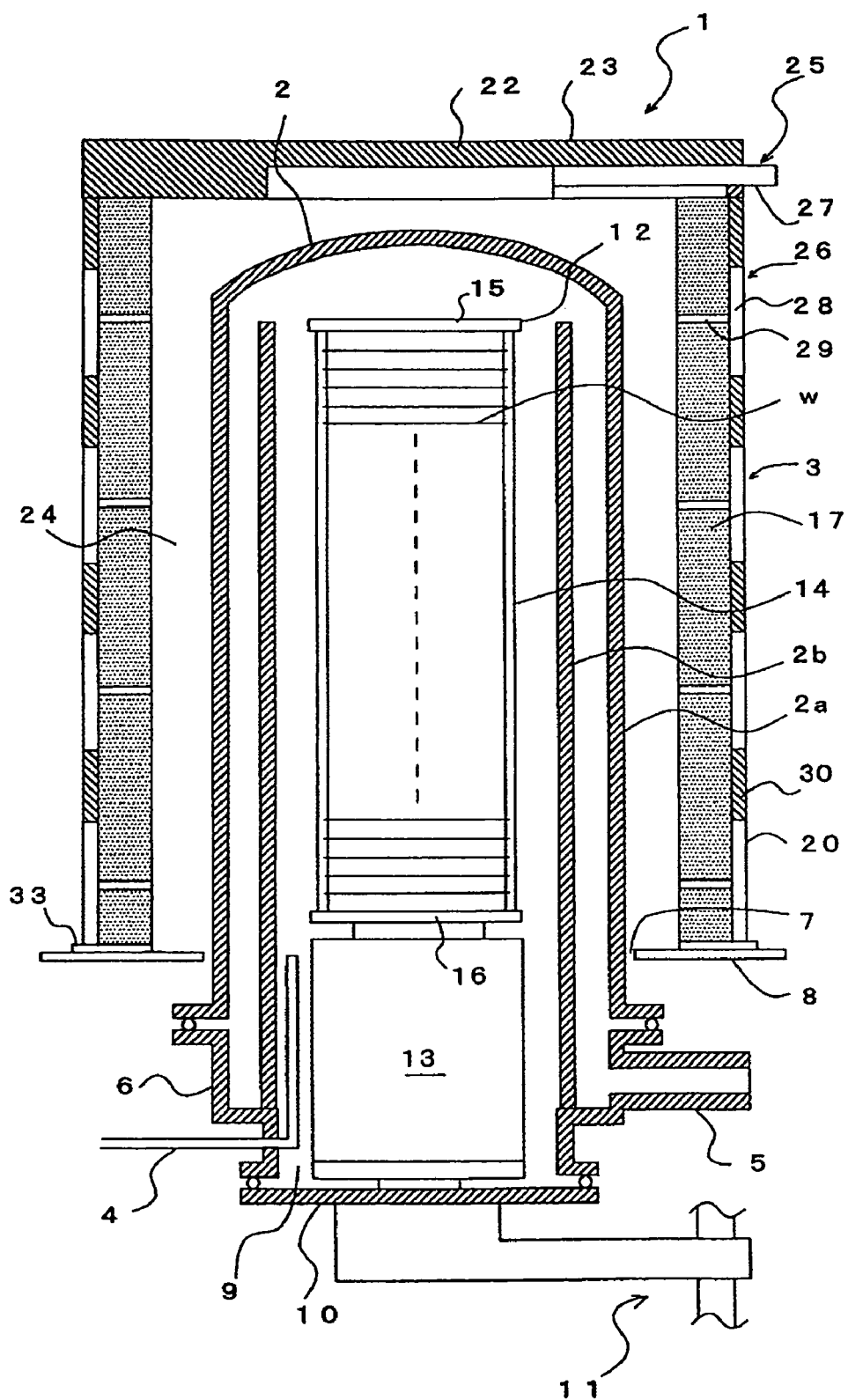
F I G. 1

HEAT TREATMENT APPARATUS, HEATER, AND METHOD FOR MANUFACTURING THE HEATER

TECHNICAL FIELD

The present invention relates to a heat treatment apparatus having an improved flow path structure for causing a cooling fluid to flow and rapidly reducing the interior temperature of a heater, a heater, and a method for manufacturing the heater.

BACKGROUND ART

In a process for manufacturing a semiconductor device, various types of treatment apparatuses (semiconductor manufacturing apparatuses) are used to perform treatments such as oxidation, diffusion and chemical vapor deposition (CVD) on an object to be treated, such as a semiconductor wafer. It is known that one of the various types of treatment apparatuses is a batch-type heat treatment apparatus, such as a vertical heat treatment apparatus, capable of simultaneously performing a treatment, such as a heat treatment, on a plurality of objects to be treated.

Such a conventional heat treatment apparatus generally has a process chamber and a tubular heater. The process chamber accommodates a plurality of wafers to be held on boats, which are provided in multiple stages at a predetermined interval and serve as holders. The heater surrounds the process chamber. The heat treatment apparatus performs a predetermined heat treatment by causing the heater to heat the wafers. The heater includes a tubular heat insulator and a linear heat generating resistor provided on an inner circumference of the tubular heat insulator.

After the heat treatment, the conventional heat treatment apparatus discharges an atmosphere present in a space existing between the heater and the process chamber and introduces a cooling fluid (such as air) into the space to forcibly cool the heater, in order to rapidly reduce the temperatures of the wafers thereby accelerating the treatment and improving the throughput of the treatment. One of such conventional heat treatment apparatuses (hereinafter called the former conventional heat treatment apparatus) has a flow path structure. In the flow path structure, a cooling fluid is distributed from a common air supply duct to a plurality of distribution tubes, each of which then distributes the cooling fluid to outlets (nozzles) through flexible tubes. The air supply duct extends in a vertical direction. The distribution tubes are provided on the outer circumference of the heater and at vertical positions different from each other. The outlets are provided in a heat insulator and at vertical positions. The outlets are arranged in the circumferential direction of the heat insulator at an appropriate interval. The outlets extend toward a central axis of the heat insulator.

In another one of conventional heat treatment apparatuses (hereinafter called the latter conventional heat treatment apparatus), a cooling fluid is supplied from an intake tube through an introduction valve to an annular intake manifold provided under a heater, as described in Patent Document 1. The cooling fluid is distributed from the intake manifold to a plurality of intake ducts extending in a vertical direction and arranged on the outer circumference of the heater at a constant interval. The cooling fluid is then distributed from each of the intake ducts to outlets (intake communication flow paths) extending through a side wall of the heater in a horizontal direction and toward a central axis of the heater and provided in top and bottom stages.

Patent Document 1: JP-A-2000-195808

In the former conventional heat treatment apparatus, however, it is necessary that an adjustment valve or an adjustment damper be provided for each of the distribution tubes in order to adjust the rate of the reduction in the temperature of each part of the heater. The fluid path structure for forcibly cooling the inside of the heater with air is complicated. The number of parts necessary for the structure is large. This leads to an increase in the cost and difficulty in sealing. Since the flexible tubes branched from the distribution tubes are connected to the outlets (nozzles) in the flow path structure, the positions and the number of the outlets and the like are limited, and the degree of freedom of the outlet design is low. In the latter conventional heat treatment apparatus, because the positions and the number of the outlets and the like are limited due to the intake ducts, the degree of freedom of the outlet design is low. It is difficult to adjust the amount of the cooling fluid to be supplied to each of the outlets and used to adjust the rate of the reduction in the temperature of each part of the heater.

DISCLOSURE OF THE INVENTION

To solve the problems of the abovementioned conventional techniques, an object of the present invention is to provide a heat treatment apparatus, a heater and a method for manufacturing the heater. The heat treatment apparatus has a high degree of freedom of an outlet design and is capable of adjusting the rate of a reduction in the temperature of each part of a heater based on the outlet design without using an adjustment valve. In addition, the heat treatment apparatus having a simple flow path structure can be constructed with simplified sealing and a reduced cost.

According to the present invention, the heat treatment apparatus includes a process chamber, a tubular heater, a heat exhaust system, and cooling means. The process chamber, in which a predetermined heat treatment is performed, is capable of accommodating objects to be placed in multiple stages and to be treated. The heater surrounds an outer circumference of the process chamber and heats the objects to be treated. The heat exhaust system is adapted to exhaust an atmosphere present in a space existing between the heater and the process chamber. The cooling means is adapted to blow a cooling fluid into the space to cool the atmosphere in the space. The heater has a tubular heat insulator, a heat generating resistor and an outer shell. The heat generating resistor is provided on an inner circumference of the heat insulator. The outer shell covers an outer circumference of the heat insulator. The cooling means has an annular flow path and an outlet. The annular flow path is provided between the heat insulator and the outer shell. A cooling fluid flows in the annular flow path. The outlet is provided in the heat insulator. The cooling fluid in the annular flow path is blown out of the outlet into the inside of the heat insulator.

In the heat treatment apparatus according to the present invention, a plurality of the annular flow paths is provided between the heat insulator and the outer shell and arranged in a vertical direction.

In the heat treatment apparatus according to the present invention, a common supply duct is provided on the outer side of the outer shell and extends in the vertical direction. The supply duct is adapted to supply a cooling fluid to each of the annular flow paths.

In the heat treatment apparatus according to the present invention, a band-shaped annular outer heat insulator is provided on the outer circumference of the heat insulator to form an annular flow path between the heat insulator and the outer shell.

In the heat treatment apparatus according to the present invention, an annular groove is formed on the outer circumference of the heat insulator to form an annular flow path between the heat insulator and the outer shell.

In the heat treatment apparatus according to the present invention, the outlet in the heat insulator extends toward a vertical central axis of the heat insulator or in a direction oblique to the direction toward the vertical central axis of the heat insulator.

According to the present invention, the heater includes a tubular heat insulator, a heat generating resistor, and an outer shell. The heat generating resistor is provided on an inner circumference of the heat insulator. The outer shell covers an outer circumference of the heat insulator. An annular flow path, in which a cooling fluid flows, is provided between the heat insulator and the outer shell. An outlet is provided in the heat insulator. The cooling fluid in the annular flow path is blown out from the outlet to the inside of the heat insulator.

According to the present invention, the method for manufacturing a heater having a tubular heat insulator, a heat generating resistor provided on an inner circumference of the heat insulator, and an outer shell covering an outer circumference of the heat insulator, comprises the steps of: preparing the tubular heat insulator; providing a band-shaped annular outer heat insulator on the outer circumference of the heat insulator or forming an annular groove on the outer circumference of the heat insulator; forming an outlet in the heat insulator; and covering the outer circumference of the heat insulator with the outer shell to form an annular flow path in which a cooling fluid flows, the annular flow path being located between the heat insulator and the outer shell.

According to the present invention, the heat treatment apparatus includes a process chamber, a tubular heater, a heat exhaust system, and cooling means. The process chamber, in which a predetermined heat treatment is performed, is capable of accommodating objects to be placed in multiple stages and to be treated. The heater surrounds an outer circumference of the process chamber and heats the objects to be treated. The heat exhaust system is adapted to exhaust an atmosphere present in a space existing between the heater and the process chamber. The cooling means is adapted to blow a cooling fluid into the space to cool the heater. The heater has a tubular heat insulator, a heat generating resistor and an outer shell. The heat generating resistor is provided on an inner circumference of the heat insulator. The outer shell covers an outer circumference of the heat insulator. The cooling means has an annular flow path and an outlet. The annular flow path, in which a cooling fluid flows, is provided between the heat insulator and the outer shell. The outlet is provided in the heat insulator. The cooling fluid in the annular flow path is blown out from the outlet into the inside of the heat insulator. In the heat treatment apparatus according to the present invention, the plurality of annular flow paths is provided between the heat insulator and the outer shell and arranged in a vertical direction.

In the heat treatment apparatus according to the present invention, each of the outlets extends toward the vertical central axis of the heat insulator or in a direction oblique to the direction toward the vertical central axis of the heat insulator.

According to the present invention, the heat treatment apparatus has a high degree of freedom of the design of the outlets and is capable of adjusting the temperature of each part of the heater based on the design of the outlets without using an adjustment valve. The heat treatment apparatus having a simple flow path structure can be constructed with simplified sealing and a reduced cost.

In the heat treatment apparatus according to the present invention, the common supply duct is provided on the outer side of the outer shell and extends in the vertical direction. The common supply duct is adapted to supply a cooling fluid to each of the annular flow paths. This configuration of the heat treatment apparatus makes it easier to supply the cooling fluid to each of the annular flow paths.

In the heat treatment apparatus according to the present invention, the band-shaped annular outer heat insulator is provided on the outer circumference of the heat insulator to form the annular flow path between the heat insulator and the outer shell. In the heat treatment apparatus according to the present invention, the annular groove is provided on the outer circumference of the heat insulator to form the annular flow path between the heat insulator and the outer shell. Each of those configurations of the heat treatment apparatus make it possible to easily form the annular flow path on the outer circumference of the heat insulator.

According to the present invention, the heater includes the tubular heat insulator, the heat generating resistor, and the outer shell. The heat generating resistor is provided on the inner circumference of the heat insulator. The outer shell covers the outer circumference of the heat insulator. The annular flow path, in which a cooling fluid flows, is provided between the heat insulator and the outer shell. The outlet is provided in the heat insulator. The cooling fluid in the annular flow path is blown out from the outlet to the inside of the heat insulator. The heater has a high degree of freedom of the design of the outlets and is capable of adjusting the temperature of each part of the heater based on the design of the outlets without using an adjustment valve. The heater having a simple flow path structure can be constructed with simplified sealing and a reduced cost.

According to the present invention, the method for manufacturing a heater having a tubular heat insulator, a heat generating resistor provided on an inner circumference of the heat insulator, and an outer shell covering an outer circumference of the heat insulator, comprises the steps of: preparing the tubular heat insulator; providing a band-shaped annular outer heat insulator on the outer circumference of the heat insulator or forming an annular groove on the outer circumference of the heat insulator; forming an outlet in the heat insulator; and covering the outer circumference of the heat insulator with the outer shell to form an annular flow path in which a cooling fluid flows, the annular flow path being located between the heat insulator and the outer shell. The method makes it possible to increase the degree of freedom of the design of the outlets and adjust the temperature of each part of the heater based on the design of the outlets without using an adjustment valve. The heater having a simple flow path structure can be easily constructed with simplified sealing and a reduced cost.

BRIEF DESCRIPTION OF DRAWINGS

FIG. 1 is a vertical cross sectional view of a heat treatment apparatus according to an embodiment of the present invention and shows the outline of the heat treatment apparatus.

BEST MODE FOR CARRYING OUT THE INVENTION

Figure 2:
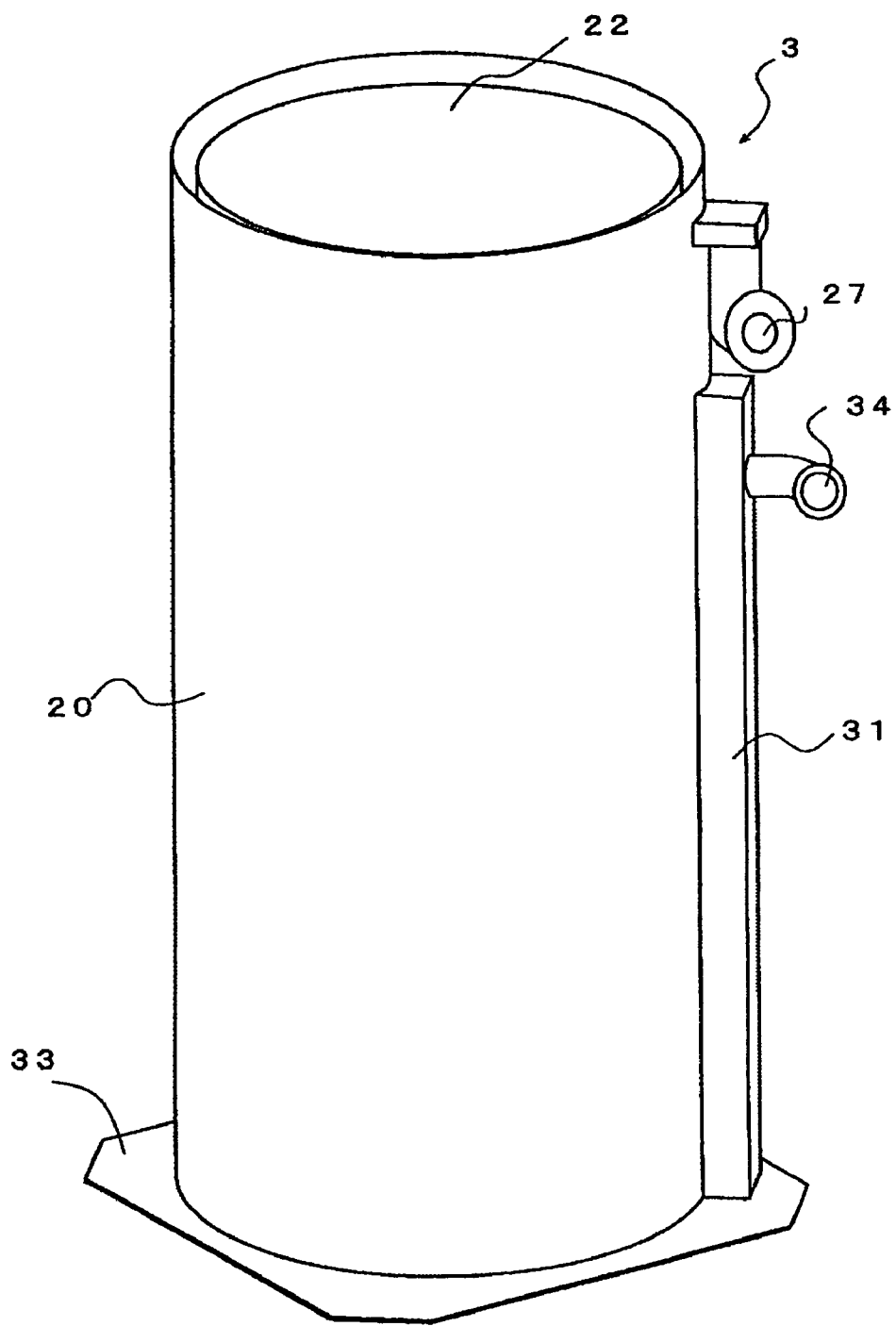
FIG. 2 is a perspective view of a heater provided in the heat treatment apparatus.
Figure 3:
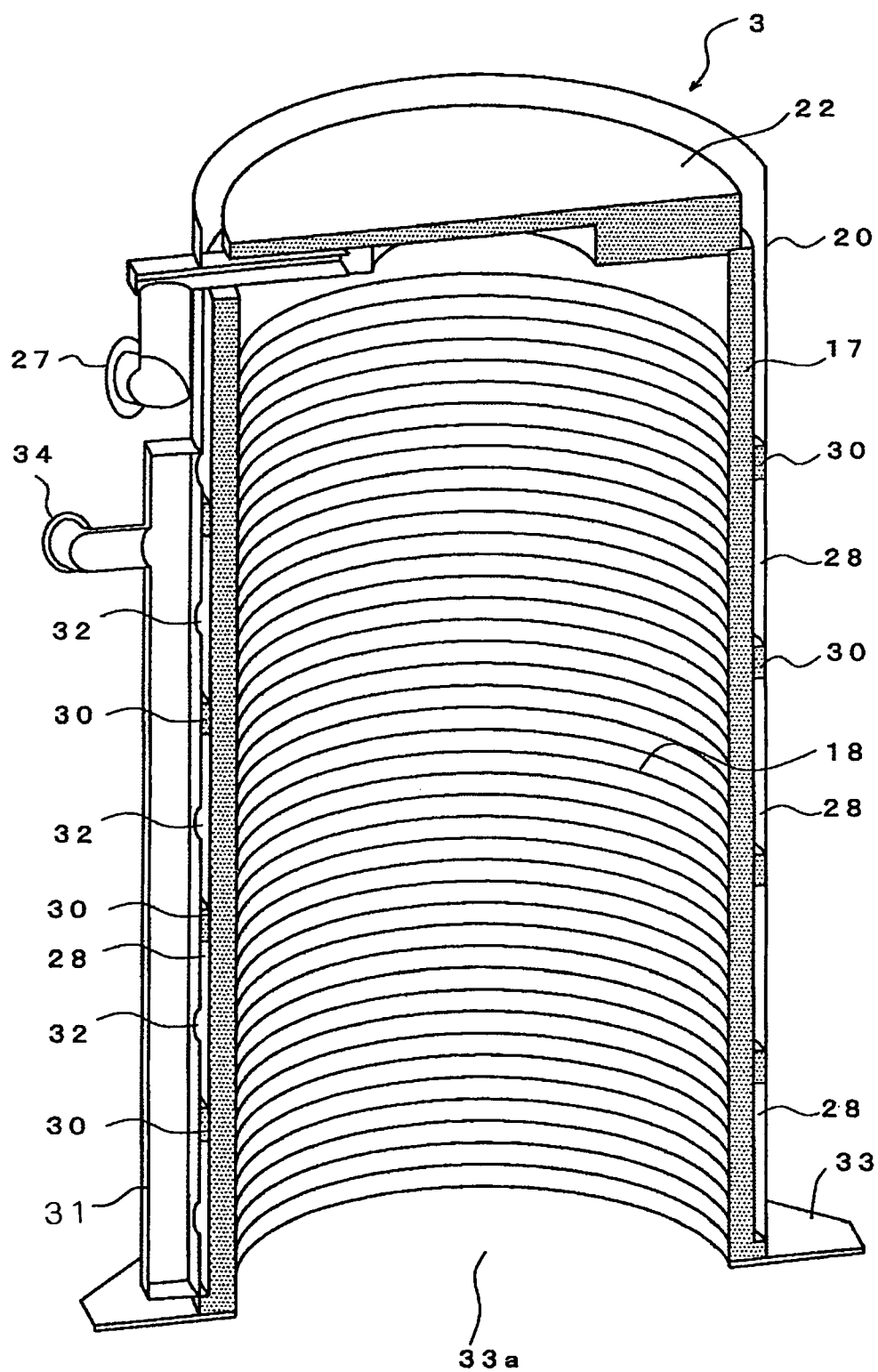
FIG. 3. is a cross sectional perspective view of the heater.
Figure 4:
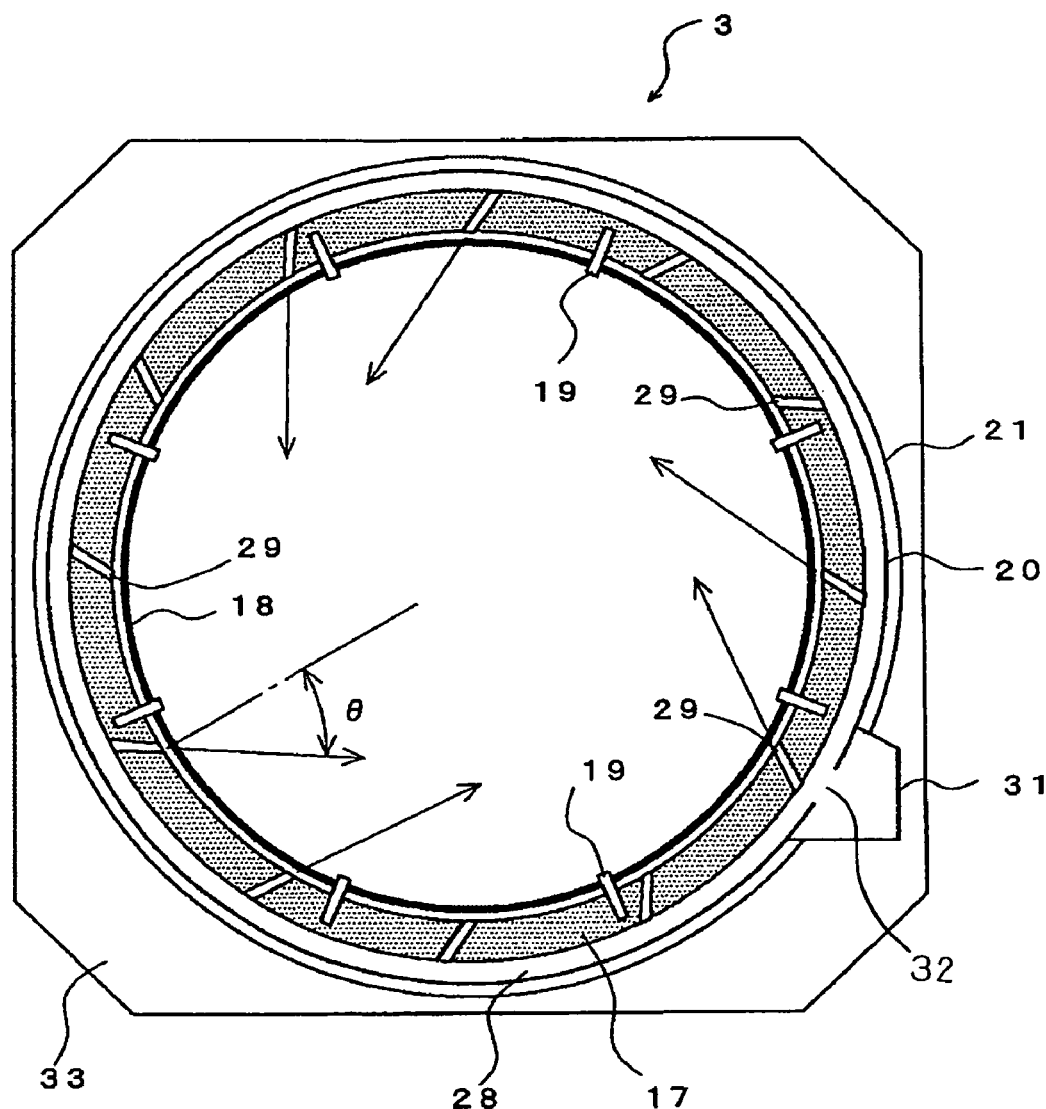
FIG. 4 is a horizontal cross sectional view of the heater.
Figure 5:
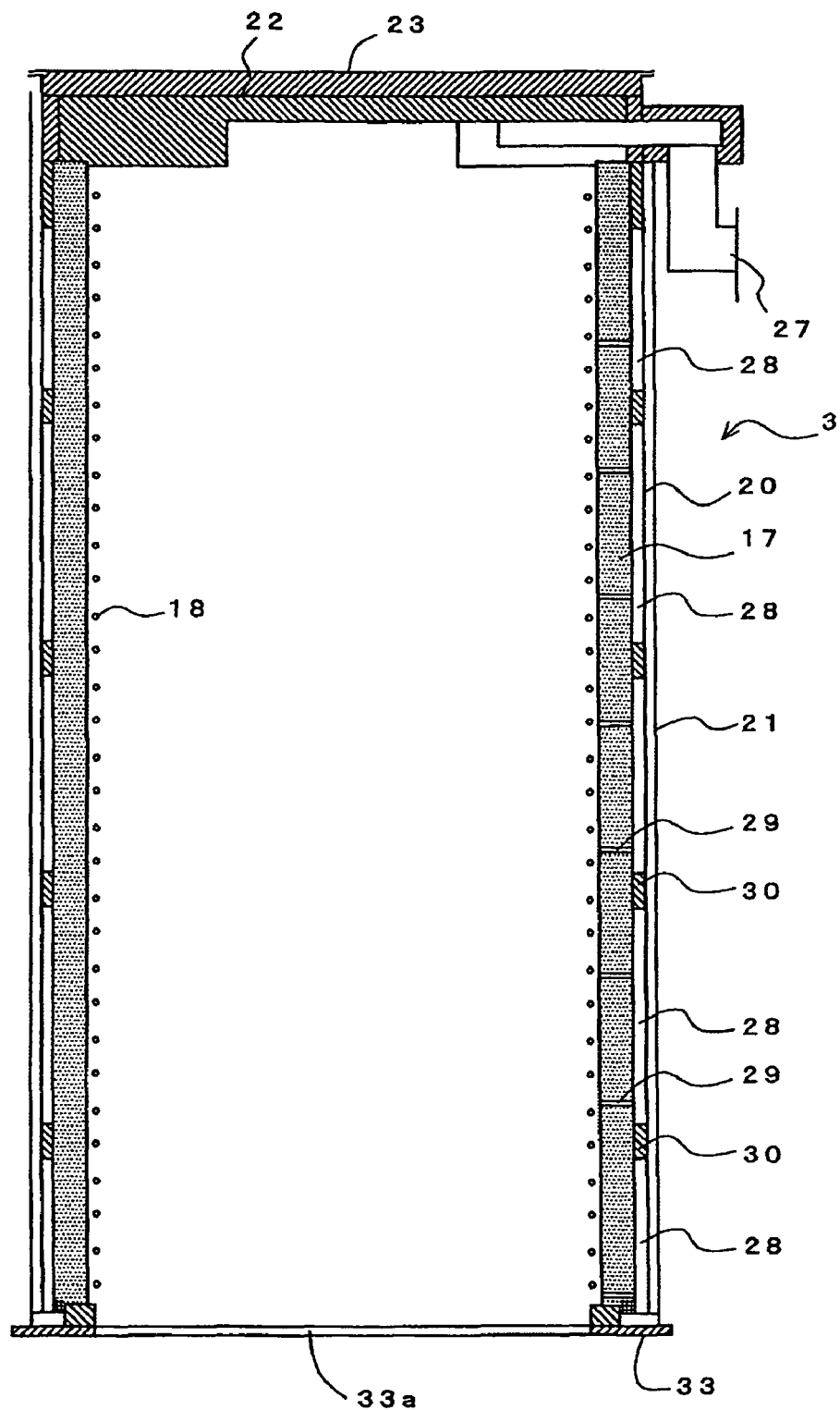
FIG. 5 is a vertical cross sectional view of the heater.

A description will be made of an embodiment of the present invention with reference to the accompanying drawings.

FIG. 1 is a vertical cross sectional view of a heat treatment apparatus according to the embodiment of the present invention. As shown in FIG. 1, the heat treatment apparatus 1 is a vertical heat treatment apparatus. The heat treatment apparatus 1 includes a process chamber (also called a reaction tube) 2 and a tubular heater 3. The process chamber 2 accommodates objects to be placed in multiple stages and to be treated, such as semiconductor wafers W. A predetermined heat treatment, such as CVD, is performed in the process chamber. The heater 3 surrounds an outer circumference of the process chamber 2 and is capable of heating the wafers W to a predetermined temperature, for example, a temperature ranging from 300° C. to 1200° C. The process chamber 2 and the heater 3 constitute a heat treatment furnace.

The process chamber 2 has a cylindrical outer tube 2a made of quartz and a cylindrical inner tube 2b made of quartz. The outer tube 2a has a top portion and a bottom portion. The top portion of the outer tube 2a is closed, while the bottom portion thereof is opened. The inner tube 2b is provided in the outer tube 2a and has a top portion and a bottom portion. The top and bottom portions of the inner tube 2b are opened. It should be noted that although the process chamber 2 has a two-tube structure with the outer tube 2a and the inner tube 2b in an example shown in FIG. 1, the process chamber 2 may have a single-tube structure with the outer tube 2a.

The heat treatment apparatus also includes an annular manifold 6. The manifold 6 has a gas introduction tube (gas introduction port) 4 and an exhaust tube (exhaust port) 5. The gas introduction tube 4 is adapted to introduce a process gas and an inert gas to be used for purge into the process chamber 2. The exhaust tube 5 is adapted to evacuate the process chamber 2. The manifold 6 is made of stainless or the like. The manifold 6 is provided under the process chamber 2 and connected with the process chamber 2 in an airtight manner. The gas introduction port 4 is connected to a tube adapted to supply a gas. The exhaust tube 5 is connected with a vacuum pump (not shown) and another exhaust tube (not shown) having a pressure control valve and the like. The vacuum pump is capable of performing control to reduce a pressure level within the process chamber 2.

The manifold 6 is attached to a base plate 8 through an attaching element (not shown). The base plate 8 has an opening 7 in which the process chamber 2 is located. The manifold 6 constitutes a furnace outlet 9 of the heat treatment furnace. A lid 10 is provided under the heat treatment furnace and adapted to open and close the furnace outlet 9. The lid 10 is movable in a vertical direction by means of a lifting mechanism 11. The lid 10 is adapted to contact an opening end of the manifold 6 and hermetically close the furnace outlet 9.

A heat treatment boat (also simply called a boat) 12 is mounted above the lid 10 through a heat retention tube 13 serving as a furnace outlet heat insulator. The heat treatment boat 12 is made of, for example, quartz. The heat treatment boat 12 holds a large number of (for example, 75 to 100) wafers placed in multiple stages at a certain interval in the vertical direction to ensure that surfaces of the wafers W are substantially parallel to a horizontal direction. In this case, the wafers W has respective diameters of, for example, 300 mm. The boat 12 is loaded in (carried in) the process chamber 12 by lifting up the lid 10 by means of the lifting mechanism 11 and unloaded from (carried out of) the process chamber 12 by lifting down the lid 10 by means of the lifting mechanism 11.

The boat 12 includes a plurality of (for example, three or four) columns 14, a top plate 15 and a bottom plate 16. The top plate 15 is provided at the top end portion of the columns 14, while the bottom plate 16 at the bottom end portion of the columns 14. Each of the columns 14 has grooves (not shown) for directly holding the wafers W to be placed in multiple stages or for holding ring-shaped support plates on which the wafers W are to be placed in multiple stages.

The heater 3 is installed on the base plate 8. The heater 3 has a tubular heat insulator (for example, a cylindrical heat insulator) 17 as shown in FIGS. 2 to 5. The heat insulator 17 is composed of silica and alumina as main components. The heat insulator 17 has a thickness of 30 mm to 40 mm, for example. A linear heat generating resistor 18 is provided on an inner circumference of the heat insulator 17 and extends in a spiral or meandering manner (refer to FIGS. 3 and 5). The heat generating resistor 18 is capable of controlling temperatures of multiple zones of the heater 3. The heater 3 is divided into the multiple zones in a direction in which the heater 3 extends. The heat insulator 17 may be divided in half in consideration of the construction of the heat generating resistor 18 and the like. The heat generating resistor 18 is held along an inner circumferential surface of the heat insulator 17 by a support member 19 (refer to FIG. 4).

An outer circumference of the heat insulator 17 is covered with an outer shell 20 made of metal such as stainless in order to maintain the shape of the heat insulator 17 and reinforce the heat insulator 17. An outer circumference of the outer shell 20 is covered with a water-cooled jacket 21 in order to reduce the amount of heat to be transferred to outside of the heater 3 (refer to FIGS. 4 and 5). An upper heat insulator 22 is provided at the top portion of the heat insulator 17 and covers the top portion of the heat insulator 17. A top plate 23 made of stainless is provided at the top portion of the upper heat insulator 22 and covers the top portion of the outer shell 20.

The heat has a heat exhaust system 25 and a cooling section 26, in order to rapidly reduce temperatures of the wafers thereby quickly performing the treatment and improving the throughput of the treatment. The heat exhaust system 25 is adapted to exhaust an atmosphere present in a space 24 existing between the heater 3 and the process chamber 2. The cooling section 26 is adapted to introduce a cooling fluid (for example, air) into the space and forcibly cool the heater. The heat exhaust system 25 is mainly composed of an exhaust outlet 27 and a heat exhaust tube (not shown). The exhaust outlet 27 is provided at the top portion of the heater 3. The heat exhaust tube connects the exhaust outlet 27 and a factory exhaust system (not shown). The heat exhaust tube includes an exhaust blower (not shown) and a heat exchanger (not shown).

The cooling section 26 includes a plurality of annular flow paths 28 and outlets 29. The plurality of annular flow paths 28 are located between the heat insulator 17 and the outer shell 20 and arranged in the vertical direction. Each of the outlets 29 is provided in the heat insulator 17 to ensure that a cooling fluid is blown out of the outlet 29 in a direction oblique to the direction from the outlet 29 toward a vertical central axis of the heat insulator 17 and a swirling flow occurs in a circumferential direction of the space 24. Each of the annular flow paths 28 is formed by attaching a band-shaped or annular outer heat insulator 30 to the outer circumference of the heat insulator 17 or by forming an annular groove on the outer circumference of the heat insulator 17.

In the example shown in the drawings, a plurality of the outer heat insulators 30 are provided. Each of the outer heat insulators 30 has a predetermined thickness (of 15 mm to 20 mm) and a predetermined width (of 30 mm to 50 mm). The annular outer heat insulators 30 are engaged with and fixed to the outer circumference of the cylindrical heat insulator 17 by an adhesive and arranged in the vertical direction (axial direction) at a predetermined interval. The annular flow paths 28 are formed in multiple stages in the vertical direction and on the outer circumference of the cylindrical heat insulator 17 by fitting the cylindrical outer shells 20 to the outside of the cylindrical heat insulator 17 through the annular outer heat insulators 30.

A plurality of the outlets 29 are provided for each of the annular flow paths 28 in the circumferential direction of the annular flow path 28 at a substantially constant interval. The number of the outlets 29 is, for example, four to fifteen. For each of the annular flow paths 28, the outlets 29 are arranged in one or two stages in the vertical direction based on the rate of a reduction in the temperature of each part of the heater. Each of the outlets 29 extends at a predetermined angle θ, for example, an angle of 35 degrees with respect to the direction from the outlet 29 toward a vertical central axis of the heater 3 in a horizontal plane. The outlets 29 are arranged to form a swirling flow of the cooling fluid which spirally flows along the circumferential direction of the space 24. The outlets 29 are formed by forming openings by means of a drill or the like from the inner side or outer side of the heat insulator 17 before the outer shell 20 is installed.

Since an ascending flow is generated in the space 24 present in the heater 3 by suctioning exhaust air through the exhaust outlet 27 provided at the top portion of the heater 3, it is not necessary that each of the outlets 29 extends in an obliquely upward direction. In the drawings, the outlets 29 extend in the horizontal direction. The outlets 29 may extend in an obliquely upward direction. The outlets 29 may be formed by embedding nozzles in the heat insulator 17. In this case, each of the nozzles may have an end portion extending between the heat generating resistors 18 adjacent to each other.

A common supply duct 31 is provided on an outer surface of the outer shell 20 and extends in the vertical direction. The supply duct 31 is adapted to supply a cooling fluid to each of the annular flow paths 28. Communication outlets 32 are provided in the outer shell 20 and adapted to communicate the inside of the supply duct 31 with the respective annular flow paths 28. The supply duct 31 has an inlet port 34 connected with a cooling fluid supply source (which is not shown and is, for example, an air blower) through an opening-closing valve. The cooling fluid supply source suctions air present in a clean room as the cooling fluid and forcibly feeds the air. A bottom plate 33 having an opening 33a is provided at a bottom portion of the heater 3. The bottom plate 33 is fixed to the base plate 8 by means of a bolt or the like.

The heat treatment apparatus 1 is configured as described above. A method for manufacturing the heater 3 comprises the steps of: forming a plurality of the annular flow paths 28 to be arranged between the heat insulator 17 and the outer shell 20 and in the vertical direction by attaching the band-shaped or annular outer heat insulators 30 to the outer circumference of the heat insulator 17 or by forming an annular groove on the outer circumference of the heat insulator 17 to form grooves in the heat insulator 17; and forming each of the outlets 29 to ensure that a cooling fluid is blown out of the outlet 29 in a direction oblique to the direction from the outlet 29 toward the vertical central axis of the heat insulator 17 and that a swirling flow of the cooling fluid occurs.

The heat treatment apparatus 1 includes the process chamber 2, the tubular heater 3, the heat exhaust system 25 and the cooling section 26. The process chamber 2 accommodates wafers W to be placed in multiple stages. A predetermined heat treatment is performed in the process chamber. The heater 3 surrounds the outer circumference of the process chamber 2 and is capable of heating the wafers W. The heat exhaust system 25 is adapted to exhaust an atmosphere present in the space 24 existing between the heater 3 and the process chamber 2. The cooling section 26 is adapted to blow a cooling fluid into the space 24 to cool the atmosphere. The heater 3 includes the heat insulator 17 and the heat generating resistor 18 provided on the inner circumference of the heat insulator 17. The outer shell 20 covers the outer circumference of the heat insulator 17. The cooling section 26 includes the plurality of annular flow paths 28 and the outlets 29. The annular flow paths 28 are arranged between the heat insulator 17 and the outer shell 20 and in the vertical direction. Each of the outlets 29 is provided in the heat insulator 17 to ensure that a cooling fluid is blown out of the outlet 29 in a direction oblique to the direction from the outlet toward the vertical central axis of the heat insulator 17 and that a swirling flow occurs in the circumferential direction of the space 24. This makes it possible to improve the degree of freedom of the design of the outlets 29 and adjust the temperature of each part of the heater 3 based on the design of the outlets 29 without using an adjustment valve. The heat treatment apparatus having a simple flow path structure can be constructed with simplified sealing and a reduced cost.

The plurality of annular flow paths 28 is provided between the heat insulator 17 and the outer shell 20 and along the circumferential direction of the heat insulator 17. The annular flow paths 28 are arranged in multiple stages in the vertical direction (axial direction). The outlets 29 are provided in the heat insulator 17. An appropriate number of the outlets 29 are provided for each of the annular flow paths 28 arranged in multiple stages. The number of the outlets 29 provided for each of the annular flow paths 28 may be varied. The degree of freedom of the design for the arrangement and the number of the outlets is high. The rate of the reduction in the temperature of each part of the heater can be set by adjusting the number and the arrangement of the outlets 29.

The common supply duct 31 is provided on the outer surface of the outer shell 20 and extends in the vertical direction. The supply duct 31 is adapted to supply a cooling fluid to each of the annular flow paths 28. The cooling fluid is easily supplied to each of the annular flow paths 28. This simplifies the flow path structure. The annular flow paths 28 are formed by attaching band-shaped or annular outer heat insulators 30 to the outer circumference of the heat insulator 17 or by cutting annular portions of the outer circumference of the heat insulator 17 to form grooves in the heat insulator 17. Therefore, the annular flow paths 28 can be easily formed between the outer circumference of the heat insulator 17 and the outer shell 20.

The heater 3 includes the tubular heat insulator 17, the heat generating resistor 18 and the outer shell 20. The heat generating resistor 18 is provided on the inner circumference of the heat insulator 17. The outer shell 20 is provided on the outer circumference of the heat insulator 17. The plurality of annular flow paths 28 is arranged between the heat insulator 17 and the outer shell 20 and in the vertical direction. Each of the outlets 29 is provided in the heat insulator 17 to ensure that a cooling fluid is blown out of the outlet 29 in a direction oblique to the direction from the outlets 29 toward the vertical central axis of the heat insulator 17 and that a swirling flow of the cooling fluid occurs. This makes it possible to improve the degree of freedom of the design of the outlets 29 and adjust the temperature of each part of the heater 3 based on the design of the outlets 29 without using an adjustment valve. The heat treatment apparatus having a simple flow path structure can be constructed with simplified sealing and a reduced cost. In addition, the method for manufacturing the heater 3 comprises the steps of: forming the plurality of annular flow paths 28 to be arranged between the heat insulator 17 and the outer shell 20 and in the vertical direction by attaching the band-shaped or annular outer heat insulators 30 to the outer circumference of the heat insulator 17 or by cutting annular portions of the outer circumference of the heat insulator 17 to form grooves in the heat insulator 17; and forming each of the outlets 29 to ensure that a cooling fluid is blown out of the outlet 29 in a direction oblique to the direction from the outlet 29 toward the vertical central axis of the heat insulator 17 and that a swirling flow of the cooling fluid occurs. This makes it possible to improve the degree of freedom of the design of the outlets 29 and adjust the temperature of each part of the heater 3 based on the design of the outlets 29 without using an adjustment valve. The method allows the heater provided with the simple flow path structure to be easily constructed with simplified sealing and a reduced cost.

Figure 6:
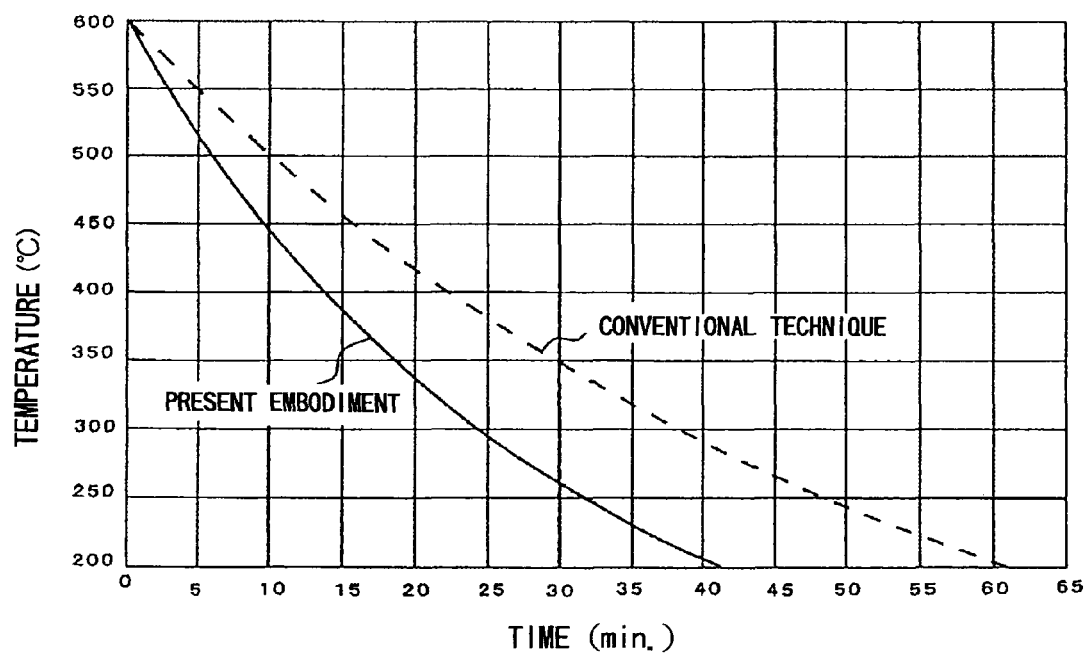
FIG. 6 is a graph showing a reduction in the temperature of the heater.

An experiment was carried out to compare a reduction in the temperature of the heater provided in the heat treatment apparatus according to the present embodiment with a reduction in the temperature of a conventional heater provided in a heat treatment apparatus under the same conditions (the same parts of the heater, the same performance of an air blower, and the like). The results of the comparison, which are shown in the graph of FIG. 6, were obtained. Based on the results of the comparison, it takes approximately 60 minutes to reduce the temperature of the conventional heater provided in the heat treatment apparatus from 600° C. to 200° C., while it takes approximately 40 minutes to reduce the temperature of the heater provided in the heat treatment apparatus according to the present embodiment from 600° C. to 200° C. The time for reducing the temperature of the heater is reduced by approximately 20 minutes.

Although the embodiment of the present invention is described above with reference to the accompanying drawings, the present invention is not limited to the abovementioned embodiment. Various modifications to the embodiment may be made without departing from the spirit and scope of the present invention. Although the plurality of annular flow paths are arranged in the vertical direction in the embodiment of the present invention, the number of the annular flow paths may be one. In the embodiment of the present invention, each of the outlets is arranged to ensure that a cooling fluid is blown out of the outlet in a direction oblique to the direction from the outlet toward the vertical central axis of the heat insulator. Each of the outlets may be arranged to ensure that a cooling fluid is blown out of the outlet in the direction from the outlet toward the vertical central axis of the heat insulator.

The invention claimed is

1. A heat treatment apparatus comprising:
a process chamber configured to accommodate objects to be placed in multiple stages and to be treated and performing a predetermined heat treatment;
a tubular heater configured to heat the objects to be treated, the heater surrounding an outer circumference of the process chamber;
a heat exhaust system configured to exhaust an atmosphere present in a space existing between the heater and the process chamber; and
cooling means configured to blow a cooling fluid into the space to cool the atmosphere in the space, wherein
the heater includes a tubular heat insulator, a heat generating resistor, and an outer shell, the heat generating resistor being provided on an inner circumference of the tubular heat insulator, the outer shell covering an outer circumference of the tubular heat insulator,
the cooling means includes an outlet and an annular flow path in which the cooling fluid flows, the annular flow path being provided between the tubular heat insulator and the outer shell, the outlet being provided in the tubular heat insulator, the cooling fluid in the annular flow path being blown out of the outlet into the inside of the tubular heat insulator,
a plurality of annular flow paths are provided between the tubular heat insulator and the outer shell and are arranged in a vertical direction, and
a common supply duct is provided on the outer side of the outer shell and extends in the vertical direction, the common supply duct being adapted to supply a cooling fluid to each of the annular flow paths.

2. The heat treatment apparatus according to claim 1, wherein
the outlet provided in the tubular heat insulator extends toward a vertical central axis of the heat insulator or in a direction oblique to the direction toward the vertical central axis of the tubular heat insulator.

3. A heat treatment apparatus comprising:
a process chamber configured to accommodate objects to be placed in multiple stages and to be treated and performing a predetermined heat treatment;
a tubular heater configured to heat the objects to be treated, the heater surrounding an outer circumference of the process chamber;
a heat exhaust system configured to exhaust an atmosphere present in a space existing between the heater and the process chamber; and
cooling means configured to blow a cooling fluid into the space to cool the atmosphere in the space, wherein
the heater includes a tubular heat insulator, a heat generating resistor, and an outer shell, the heat generating resistor being provided on an inner circumference of the tubular heat insulator, the outer shell covering an outer circumference of the tabular heat insulator,
the cooling means includes an outlet and an annular flow path in which the cooling fluid flows, the annular flow path being provided between the tubular heat insulator and the outer shell, the outlet being provided in the tubular heat insulator, the cooling fluid in the annular flow path being blown out of the outlet into the inside of the tubular heat insulator, and
a band-shaped annular outer heat insulator is provided on the outer circumference of the tubular heat insulator to form the annular flow path between the tubular heat insulator and the outer shell.

4. The heat treatment apparatus according to claim 3, wherein
the outlet provided in the tubular heat insulator extends toward a vertical central axis of the heat insulator or in a direction oblique to the direction toward the vertical central axis of the tubular heat insulator.

5. A heat treatment apparatus comprising:
a process chamber configured to accommodate objects to be placed in multiple stages and to be treated and performing a predetermined heat treatment;
a tubular heater configured to heat the objects to be treated, the heater surrounding an outer circumference of the process chamber;
a heat exhaust system configured to exhaust an atmosphere present in a space existing between the heater and the process chamber; and
cooling means configured to blow a cooling fluid into the space to cool the atmosphere in the space, wherein
the heater includes a tubular heat insulator, a heat generating resistor, and an outer shell, the heat generating resistor being provided on an inner circumference of the tubular heat insulator, the outer shell covering an outer circumference of the tubular heat insulator, the cooling means includes an outlet and an annular flow path in which the cooling fluid flows, the annular flow path being provided between the tubular heat insulator and the outer shell, the outlet being provided in the tubular heat insulator, the cooling fluid in the annular flow path being blown out of the outlet into the inside of the tubular heat insulator, and an annular groove is provided on the outer circumference of the tubular heat insulator to form the annular flow path between the tubular heat insulator and the outer shell.

6. The heat treatment apparatus according to claim 5, wherein the outlet provided in the tubular heat insulator extends toward a vertical central axis of the heat insulator or in a direction oblique to the direction toward the vertical central axis of the tubular heat insulator.

7. A heater comprising:

a tubular heat insulator;

a heat generating resistor provided on an inner circumference of the tubular heat insulator; and an outer shell covering an outer circumference of the tubular heat insulator, wherein an annular flow path, in which a cooling fluid flows, is provided between the tubular heat insulator and the outer shell, an outlet is provided in the tubular heat insulator, the cooling fluid in the annular flow path being blown out of the outlet into the inside of the tubular heat insulator, a plurality of annular flow paths are provided between the tubular heat insulator and the outer shell and are arranged in a vertical direction, and a common supply duct is provided on the outer side of the outer shell and extends in the vertical direction, the common supply duct being adapted to supply a cooling fluid to each of the annular flow paths.

8. A method for manufacturing a heater having a tubular heat insulator, a heat generating resistor provided on an inner circumference of the tubular heat insulator, and an outer shell covering an outer circumference of the tubular heat insulator, the method comprising the steps of:

preparing the tubular heat insulator;

providing a band-shaped annular outer heat insulator on the outer circumference of the tubular heat insulator, or forming an annular groove on the outer circumference of the tubular heat insulator;

forming an outlet in the tubular heat insulator; and covering the outer circumference of the tubular heat insulator with the outer shell to form an annular flow path in which a cooling fluid flows, the annular flow path being located between the tubular heat insulator and the outer shell.

9. A heater comprising:

a tubular heat insulator;

a heat generating resistor provided on an inner circumference of the tubular heat insulator; and an outer shell covering an outer circumference of the tubular heat insulator, wherein an annular flow path, in which a cooling fluid flows, is provided between the tubular heat insulator and the outer shell, an outlet is provided in the tubular heat insulator, the cooling fluid in the annular flow path being blown out of the outlet into the inside of the tubular heat insulator, and a band-shaped annular outer heat insulator is provided on the outer circumference of the tubular heat insulator to form the annular flow path between the tubular heat insulator and the outer shell.

10. A heater comprising:

a tubular heat insulator;

a heat generating resistor provided on an inner circumference of the tubular heat insulator; and an outer shell covering an outer circumference of the tubular heat insulator, wherein an annular flow path, in which a cooling fluid flows, is provided between the tubular heat insulator and the outer shell, an outlet is provided in the tubular heat insulator, the cooling fluid in the annular flow path being blown out of the outlet into the inside of the tubular heat insulator, and an annular groove is provided on the outer circumference of the tubular heat insulator to form the annular flow path between the tubular heat insulator and the outer shell.

* * * * *